United States Patent
Kamino et al.

(10) Patent No.: US 7,387,916 B2
(45) Date of Patent: Jun. 17, 2008

(54) SHARP CORNER LEAD FRAME

(75) Inventors: Teiji Kamino, Beppu (JP); Kiyoshi Yajima, Oita (JP); Takhiko Koudoh, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/903,748

(22) Filed: Dec. 2, 2004

(65) Prior Publication Data

US 2006/0118923 A1    Jun. 8, 2006

(51) Int. Cl.
*H01L 21/44* (2006.01)
*H01L 21/48* (2006.01)
*H01L 21/50* (2006.01)

(52) U.S. Cl. ...................... 438/123; 438/111

(58) Field of Classification Search ............... 438/123, 438/124, 111, 121, 553, 942; 257/666–667; 428/620
See application file for complete search history.

(56) References Cited

U.S. PATENT DOCUMENTS

| | | | | |
|---|---|---|---|---|
| 4,722,060 A | * | 1/1988 | Quinn et al. | 716/19 |
| 5,717,246 A | * | 2/1998 | Brooks et al. | 257/666 |
| 6,372,412 B1 | * | 4/2002 | Hakey et al. | 430/325 |
| 6,713,322 B2 | * | 3/2004 | Lee | 438/123 |

\* cited by examiner

*Primary Examiner*—Theresa T. Doan
*Assistant Examiner*—Dilinh Nguyen
(74) *Attorney, Agent, or Firm*—Yingsheng Tung; Wade James Brady, III; Frederick J. Telecky, Jr.

(57) ABSTRACT

An integrated circuit package lead frame, comprising a plurality of leads and a spine electrically connected to said plurality of leads, said spine comprising indentations between a pair of said leads. The indentations prevent the pair of leads from becoming electrically connected to each other after a singulation process.

8 Claims, 5 Drawing Sheets

US 7,387,916 B2

SHARP CORNER LEAD FRAME

BACKGROUND

During a typical packaging process, an integrated circuit ("IC") is mounted inside a plastic mold compound ("package"). Various points on the IC are electrically connected to lead frames circumscribing the package using bond wires. In turn, the lead frames circumscribing the package are electrically connected to an application board, such as a printed circuit board ("PCB"). In this way, multiple electrical connections are established between the IC and the PCB. For example, FIG. 1 shows a side view of an exemplary IC 100 electrically connected to lead frames 102 of a package 104 using bond wires 106. The lead frames 102 are electrically connected to a PCB 108, thereby establishing multiple electrical connections between the IC 100 and the PCB 108.

Mold compounds (i.e., packages) generally are manufactured in mass quantities. More specifically, specially-shaped molds are used to fabricate sheets having multiple mold compounds. These sheets are subjected to a cutting process or singulation process, wherein the individual mold compounds that comprise each sheet are separated from each other. A top view of an exemplary mold sheet 200 is shown in FIG. 2a. The mold sheet 200 comprises a plurality of individual mold compounds (i.e., "unit packages") 202. FIG. 2b shows a detailed top view of a unit package 202. As previously mentioned, each package 202 is circumscribed by a lead frame 204.

FIG. 2c shows a detailed top view of a design 210 of the lead frame 204. The lead frame design 210 comprises, among other things, multiple spines 212. Each spine 212 is substantially straight (i.e., no considerable bends, curves, or other angles) as shown in the figure. However, various manufacturing process errors often cause the manufactured lead frame 204 spine of FIG. 2b to differ in shape from the spine 212 of the lead frame design 210 in FIG. 2c. FIGS. 3a and 3b illustrate this concept in greater detail than FIGS. 2b and 2c. In particular, FIG. 3a shows a close-up view of the spine 212 of the lead frame design 210. Each lead frame corner 214 of the spine 212 is shown to be at an angle of approximately 90 degrees. However, as illustrated in FIG. 3b, due to manufacturing variations and errors, a manufactured lead frame 204 may result in a spine 300 having lead frame corners 302 that are rounded in shape.

Referring to FIG. 4a, during a singulation process, the manufactured lead frame 204 is sawed or otherwise cut along singulation lines 401 to separate the unit packages 202 of the mold sheet 200 from each other. As shown in FIG. 4b, the singulation process may successfully separate the unit packages 202 by cutting along the singulation lines 401 of FIG. 4a, such that the spine 300 is removed. However, because the lead frame corners 302 are round in shape, many of the leads 304 may have one or more burrs 400. Each burr 400 is simply a portion of the lead 304 to which the burr 400 is attached that was not removed during the singulation process because of the round shape of the lead frame corners 302. In many cases, burrs 400 of adjacent leads 304 may be large enough to physically abut each other, thus forming short circuit pathways 402. Each short circuit pathway 402 provides an electrical connection between adjacent leads 304, thus short circuiting the leads 304 and rendering the unit package 202 comprising the leads 304 useless.

BRIEF SUMMARY

The problems noted above are solved in large part by an integrated circuit package lead frame that prevents electrical short circuiting between leads due to burrs produced during the singulation process. One exemplary embodiment may comprise a plurality of leads and a spine electrically connected to said plurality of leads, said spine comprising indentations between a pair of said leads. The indentations prevent the pair of leads from becoming electrically connected to each other after a singulation process.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections. The terms "etchings" and "indentations" are used interchangeably.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 5A:
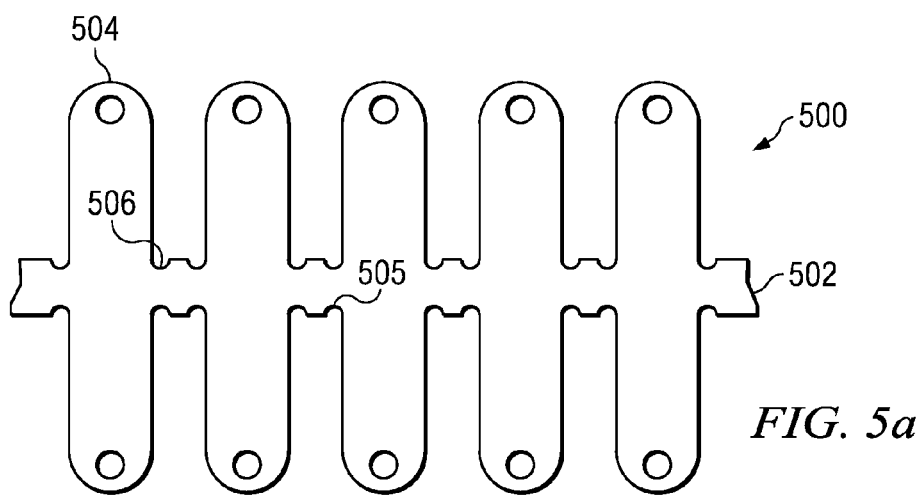
FIG. 5a shows a top view of a design of a modified lead frame, in accordance with a preferred embodiment of the invention.

Presented herein is a modified lead frame design that prevents the aforementioned problem of electrical short circuiting caused by burrs that are produced during the singulation (i.e., sawing) process. FIG. 5a shows a modified lead frame design 500 comprising a spine 502 and multiple leads 504. The modified lead frame design 500 comprises etchings (i.e, indentations) 506 along the spine 502 between the leads 504. The etchings 506 may be substantially semicircular in shape and approximately 0.1 mm in diameter, although the scope of disclosure is not limited to this shape and/or size. The preferred embodiment of the design 500 comprises two etchings 506 between each pair of leads 504 as shown in the figure, although the scope of disclosure is not limited to any particular number of etchings.

Figure 1:
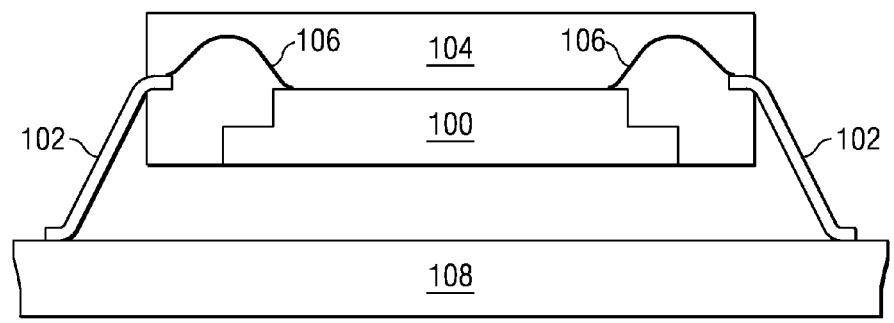
FIG. 1 shows a side view of an IC embedded in a package electrically connected to a PCB.
Figure 2A:
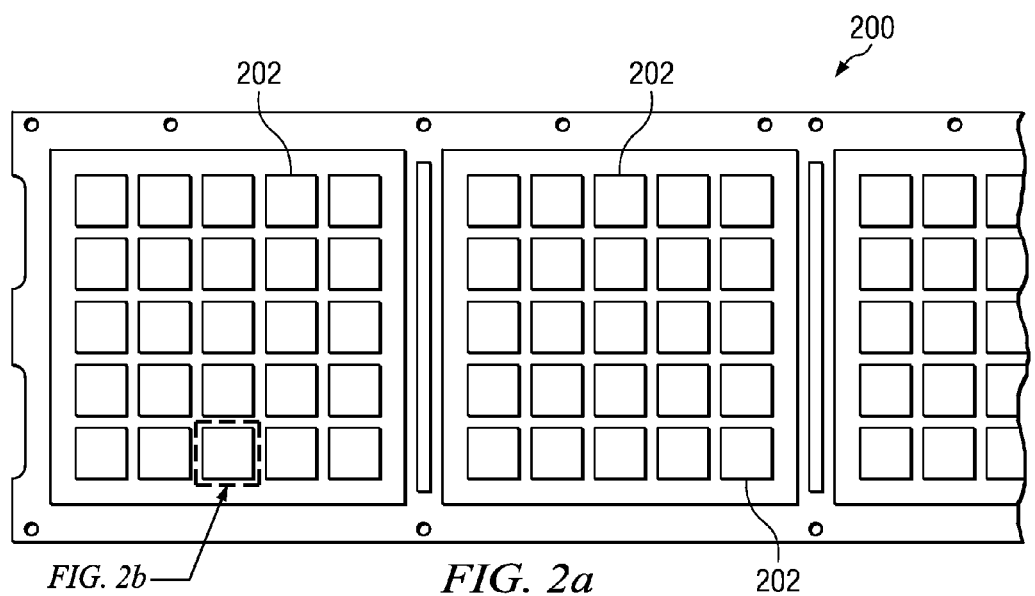
FIG. 2a shows a top view of a mold sheet comprising multiple unit packages.
Figure 2B:
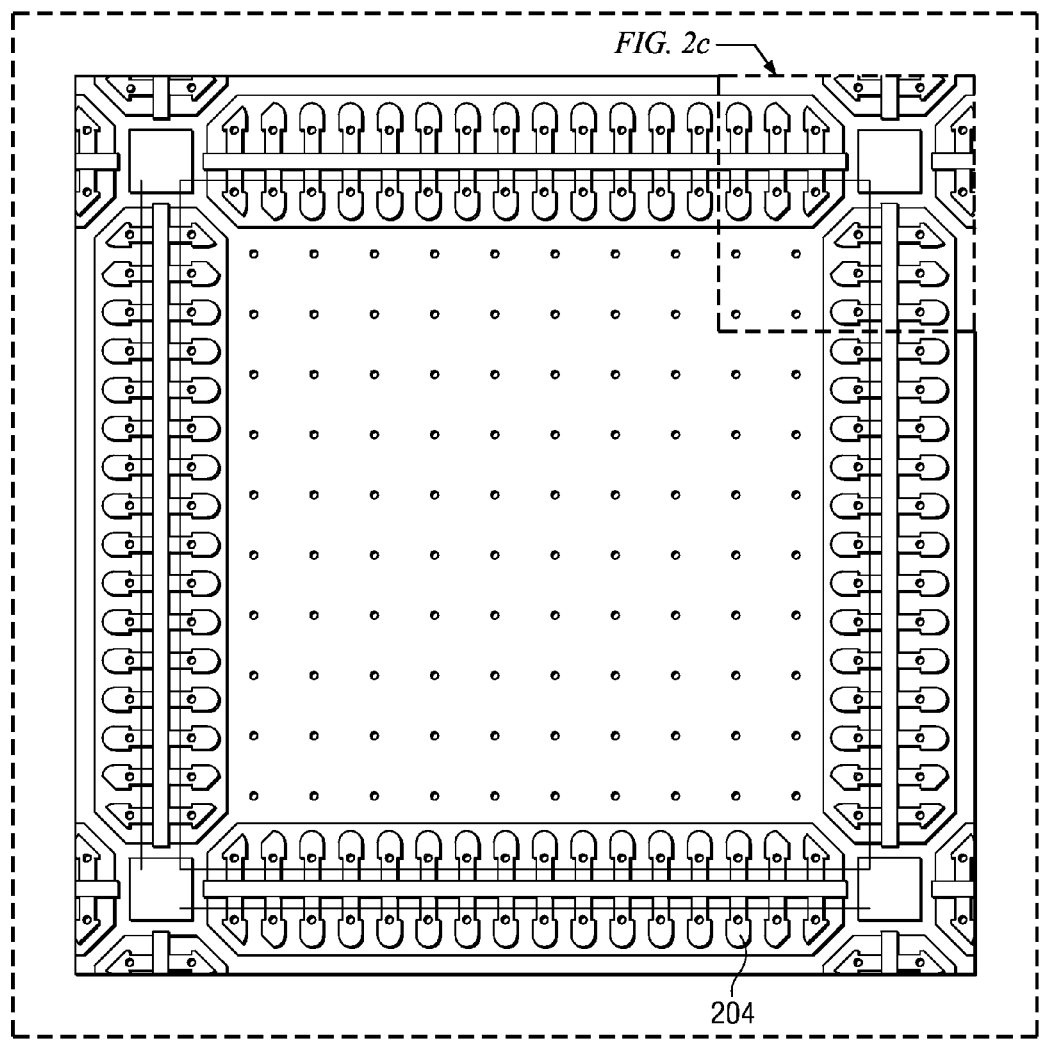
FIG. 2b shows a top view of an individual unit package having a lead frame.
Figure 2C:
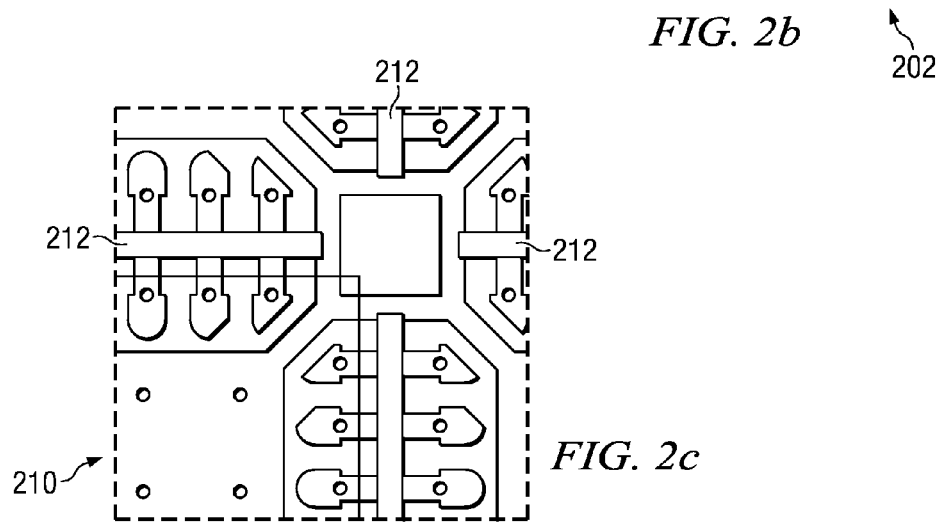
FIG. 2c shows a detailed, top view of a design of the lead frame and a lead frame spine.
Figure 3A:
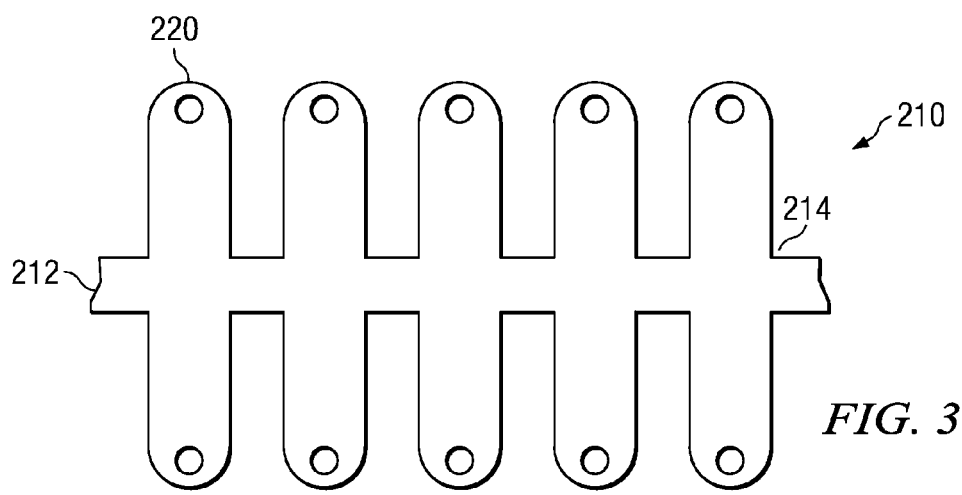
FIG. 3a shows a top view of lead frame corners of the lead frame design of FIG. 2c.
Figure 3B:
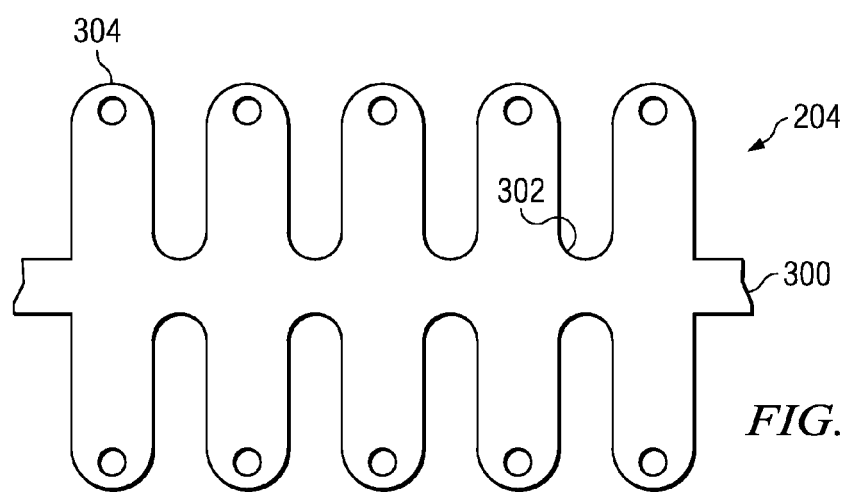
FIG. 3b shows a top view of a manufactured lead frame having rounded corners.
Figure 4A:
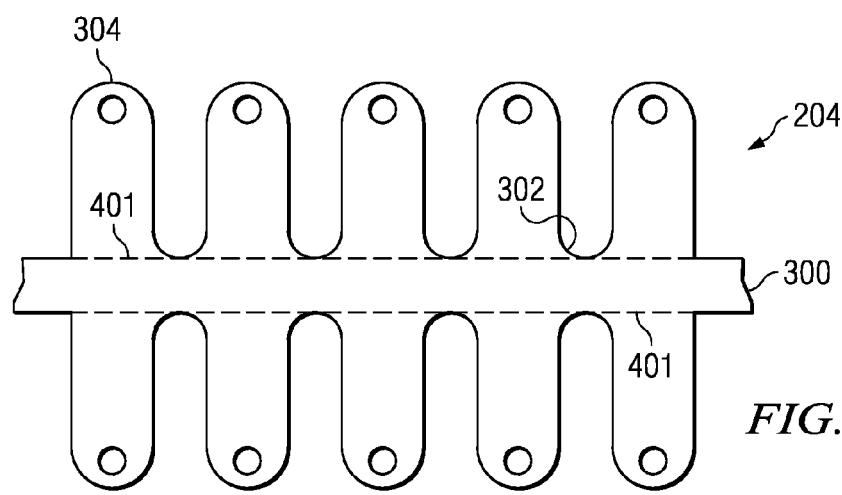
FIG. 4a shows a top view of singulation lines of the manufactured lead frame.
Figure 4B:
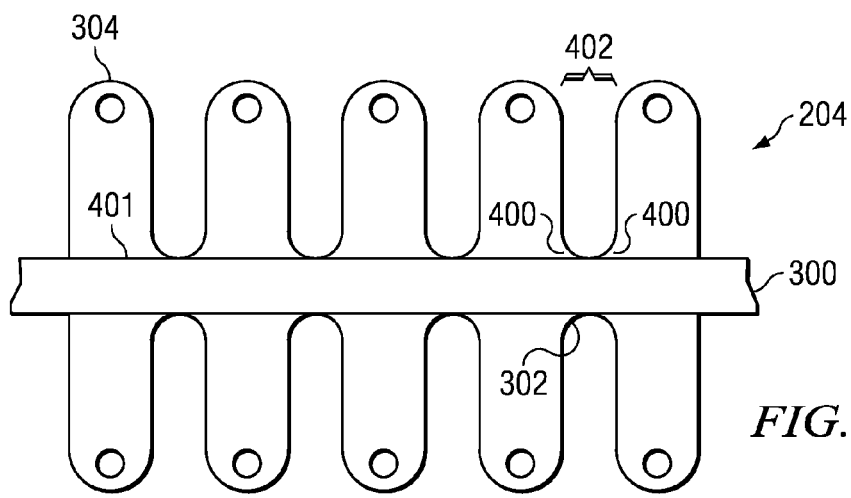
FIG. 4b shows a top view of the manufactured lead frame after a singulation process, wherein adjacent leads are electrically connected to each other.
Figure 5B:
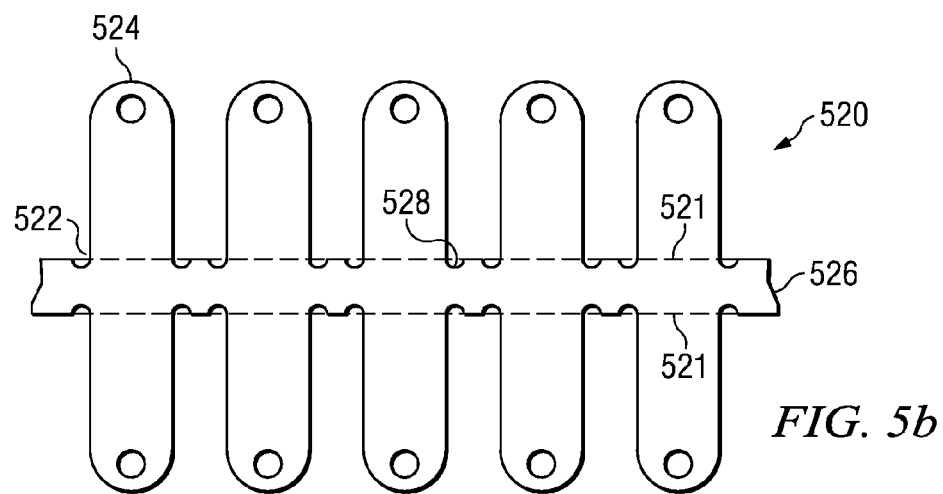
FIG. 5b shows a top view of the modified lead frame, in accordance with a preferred embodiment of the invention.

As previously discussed, because of various production errors, the lead frame 204 of FIG. 3b has rounded corners 302 that were not present in the lead frame design 210 of FIG. 3a. The modified lead frame design 500 also may be subject to such a corner-rounding effect during production. However, the corner-rounding effect on the modified lead frame design 500 will not be substantial enough to produce burrs. More specifically, FIG. 5b shows a modified lead frame 520 manufactured according to the modified lead frame design 500. The modified lead frame 520 comprises lead frame corners 522, leads 524, a spine 526 and etchings 528 along the spine 526 between each pair of leads 524.

Figure 5C:
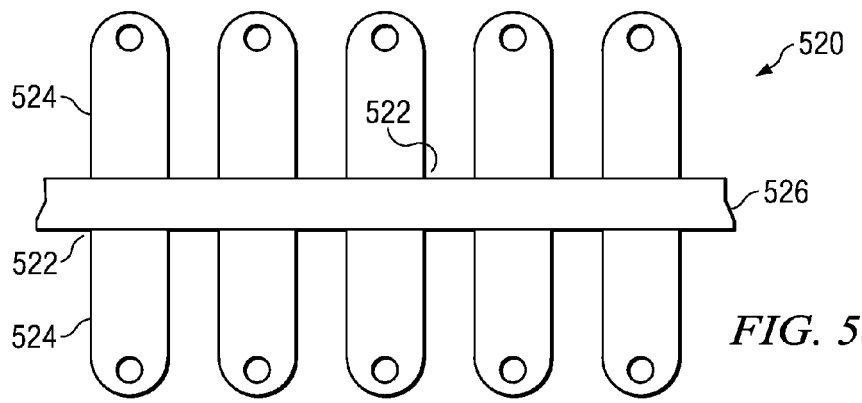
FIG. 5c shows a top view of the modified lead frame after a singulation process, in accordance with a preferred embodiment of the invention.

During the manufacturing process, lead frame corners 522 are subject to a rounding effect, thus producing corners 522 different from the corners 505 of the modified lead frame design 500. FIG. 5c shows the two separate portions of the manufactured, modified lead frame 520 after a singulation process is conducted along singulation lines 521 of FIG. 5b such that the spine 526 is removed. Although the corners 522 are subject to a rounding effect, the etchings 528 of FIG. 5b prevent the corners 522 from being rounded to a degree such that burrs are formed. Because no burrs are formed on any of the leads 524, not one of the leads 524 is short circuited by coming into electrical contact with another lead 524. Thus, the presence of the etchings 528 substantially reduces or eliminates the occurrence of short-circuited leads.

Figure 6:
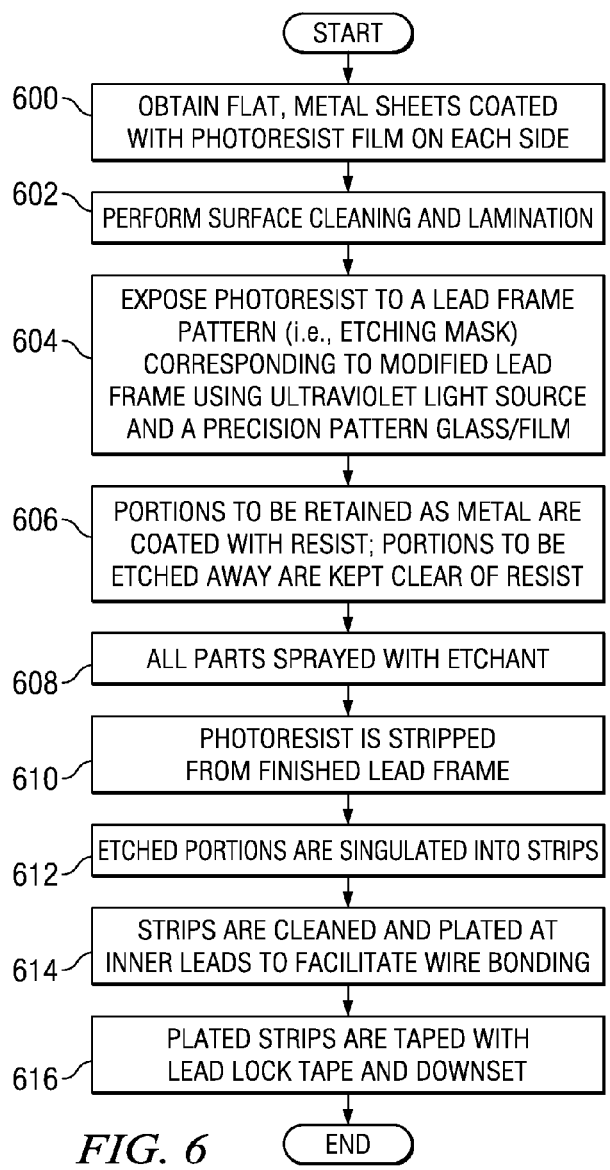
FIG. 6 shows a flow diagram of an etching process implementing the modified lead frame.

The modified lead frame 520 of FIG. 5a may be fabricated using any suitable technique. Two such techniques are etching and stamping, both of which will now be discussed in turn. FIG. 6 shows an etching process that implements the modified lead frame 520. The process may begin by obtaining flat, metal (e.g., copper) sheets, each side coated with photoresist film (block 600). The process is continued by performing surface cleaning and lamination (block 602). Next, the photoresist is exposed to a lead frame pattern (i.e., an etching mask) corresponding to the modified lead frame 520 with the aid of an ultraviolet light source and a precision pattern glass/film (block 604). Portions of the material that, are to be retained as metal are coated with resists. Conversely, portions of the material that are to be etched are kept free of resists (block 606). The material then is run through a series of nozzles spraying an etchant (block 608), after which the protective photoresist film is stripped from the finished lead frame (block 610). The etched portions subsequently are singulated (i.e., cut or sawed) into strips (block 612). The cut strips then are cleaned and plated (e.g., with silver) at the inner leads to facilitate wire bonding (block 614). Finally, the plated strips are taped with lead lock tape and downset (block 616).

Figure 7:
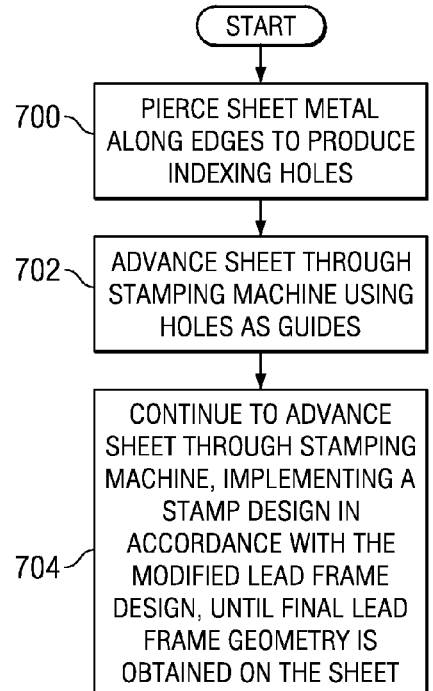
FIG. 7 shows a flow diagram of a stamping process implementing the modified lead frame.

FIG. 7 shows a stamping process that implements the modified lead frame 520 of FIG. 5a. The process may begin by piercing sheet metal along the edges to create indexing holes that position the sheet during processing (block 700). The holes are used to advance the sheet metal strip through a stamping machine which uses die-and-punch sets (i.e., stamp designs) specific to the lead frame geometry of the modified lead frame 520 (block 702). The process is continued as a series of stamping operations that progressively approach the final lead frame geometry of the modified lead frame 520, until the geometry of the modified lead frame 520 is obtained (block 704).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
exposing photoresist on a metal sheet to an etching mask, said etching mask having a geometry comprising multiple leads coupled to a spine, said spine having multiple indentations at the points of coupling and symmetrical to the spine and symmetrical to the leads;
coating with resist portions of the metal sheet to be retained;
etching portions of the metal sheet not coated with resist; and
stripping the photoresist from the metal sheet.

2. The method of claim 1, wherein exposing the photoresist to the etching mask comprises using an ultraviolet light.

3. The method of claim 2, wherein exposing the photoresist to the etching mask further comprises using a precision pattern film.

4. The method of claim 1, further comprising keeping free of resist portions of the metal sheet to be etched.

5. The method of claim 1, further comprising spraying etchant on the metal sheet.

6. The method of claim 1, further comprising:
plated the strips to facilitate wire bonding; and
taping with lead lock tape the plated strips.

7. The method of claim 1, wherein exposing said photoresist to the etching mask comprises exposing said photoresist to an etching mask, said etching mask indicative of a geometry comprising multiple leads coupled to a spine, said spine having multiple indentations, said indentations being substantially semicircular in shape.

8. The method of claim 7, wherein said indentations being approximately 0.1 mm in diameter.

* * * * *